Feb. 9, 1965 H. PUTTERMAN 3,169,199

HIGH-SPEED TRANSISTOR SWITCHING CIRCUITS

Filed Nov. 1, 1962 3 Sheets-Sheet 1

HARRY PUTTERMAN
INVENTOR.

BY S.A. Giarratana

Francis L. Masselle attorneys

TUNNEL DIODE CHARACTERISTIC

BACK DIODE CHARACTERISTIC

HARRY PUTTERMAN
INVENTOR

BY S.A. Giarratana
Francis L. Masselle
attorneys

HARRY PUTTERMAN
*INVENTOR.*

BY S. A. Giarratana
Francis L. Masselle
attorneys 3,169,199

HIGH-SPEED TRANSISTOR SWITCHING CIRCUITS

Harry Putterman, Elizabeth, N.J., assignor to General Precision Inc., Little Falls, N.J., a corporation of Delaware Filed Nov. 1, 1962, Ser. No. 234,708
8 Claims. (Cl. 307—88.5)

This invention relates to flip-flops and more particularly to high-speed flip-flops in which the switching is controlled by tunnel diodes.

The speed at which data processing equipment, digital computers and other pulse-controlled electronic systems can function is limited by the speed at which the flip-flops that they employ can be switched from one state to the other. Therefore, in order to speed up the operation of such equipment, it is desirable to increase the switching speed of the flip-flops. The present invention provides a flip-flop in which the switching time is drastically reduced from that of conventional flip-flops of the prior art.

In the present invention, a tunnel diode, together with a pair of back diodes, controls the conductive state of two transistors connected together so that when one transistor is connected together so that when one transistor is conducting, the other transistor will be biased to cut off, and vice versa. When the tunnel diode is switched from its low voltage state to its high voltage state, or vice versa, the conductive states of the transistors of the flip-flop are switched. The circuit can be switched from one state to the other much faster than the conventional flip-flops of the prior art, and the energy required to switch the circuit is greatly reduced. Moreover, the required duration of the switching pulse is greatly shortened. For example, a pulse width with a duration of 1 to 3 nanoseconds will reliably perform the switching function. In the circuit of the invention, the triggering pulse is not only applied to the tunnel diode but is also applied across the base and emitter of the transistors in the proper direction to aid switching, thus further increasing the switching speed. The flip-flop circuit provides good voltage drive at the bases of the transistors. Upon the application of power to the flip-flop circuit it will always assume the same state. The circuit has good noise immunity and has very low power dissipation.

Accordingly, a principal object of the present invention is to provide an improved flip-flop circuit.

Another object of this invention is to provide a flip-flop circuit with a faster switching time than the flip-flops of the prior art.

A further object of this invention is to provide a flip-flop circuit which requires pulses of shorter duration than those of the prior art to switch it from one state to another.

A still further object of this invention is to provide a flip-flop circuit which requires less energy to switch it from one state to another.

A still further object of this invention is to reduce the switching time of flip-flops.

A still further object of this invention is to reduce the amount of energy required to switch flip-flops from one state to another.

Further objects and advantages of this invention will become readily apparent as the following detailed description of the invention unfolds and when taken in conjunction with the drawings, wherein.

Figure 1:
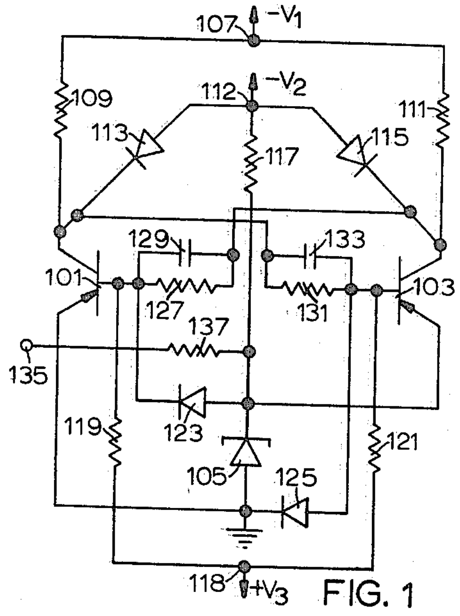
FIGS. 1 and 2 illustrate flip-flop circuits in accordance with the present invention in which PNP transistors are used.

As shown in FIG. 1, the flip-flop circuit of the present invention comprises a pair of PNP transistors 101 and 103 and a tunnel diode 105. The collectors of the transistors 101 and 103 are connected through resistors 109 and 111 respectively to a negative source of power, $-V_1$, applied at a terminal 107. The emitter of the transistor 101 is connected to ground and the emitter of the transistor 103 is connected to the cathode of the tunnel diode 105, the anode of which is connected to ground. The collector of the transistor 101 is connected through a diode 113 to a negative source of power, $-V_2$, applied at a terminal 112 with the anode of the diode 113 being connected to the termial 112 and the cathode of the diode 113 being connected to the collector of the transistor 101. A diode 115 has its anode connected to the terminal 112 and its cathode connected to the collector of the transistor 103. A resistor 117 connects the terminal 112 to the cathode of the tunnel diode 105. The base of the transistor 101 is connected through a resistor 119 to a positive source of power, $+V_2$, applied to a terminal 118 and the base of the transistor 103 is connected through a resistor 121 to the terminal 118. A back diode 125 has its anode connected to the base of the transistor 103 and its cathode connected to the ground. A back diode 123 has its anode connected to the cathode of the tunnel diode 105 and its cathode connected to the base of the transistor 101. A parallel circuit of a resistor 127 and a capacitor 129 connects the collector of the transistor 103 to the base of the transistor 101 and a parallel circuit of a resistor 131 and a capacitor 133 connects the collector of the transistor 101 to the base of the transistor 103. An input terminal 135 is connected to the cathode of the tunnel diode 105 through a resistor 137. The resistances of the resistors 119 and 121 are equal, the resistances of the resistors 127 and 131 are equal, and the resistances of the resistors 109 and 111 are equal. The resistances of the resistor 119 and 121 are substantially greater than the resistances of the resistors 127 and 131. The magnitude of the voltage $-V_1$ applied to the terminal 107 is substantially greater than that of the voltage $-V_2$.

When the power is first applied to this circuit the tunnel diode 105 will assume its low voltage state. Immediately, before equilibrium is reached, the voltage $-V_2$ applied at terminal 112 will be transferred by the diodes 113 and 115 to the collectors of transistors 101 and 103. The potential at the base of the transistor 103 will immediately drop to a more negative value than the base of the transistor 101 because the base of transistor 101 will have its potential kept up by its connection to the cathode of the tunnel diode through the back diode 123, which at this time will have voltage applied across it in the forward direction. The potential at the base of the transistor 103 will cause the back diode 125 to break down and the breakdown voltage of the back diode 125 will be the potential at the base of the transistor 103.

The potential at the emitter of the transistor 103 will be held at the relatively low negative potential at the cathode of the tunnel diode 105. As a result the base to emitter voltage of the transistor 103 will be substantially more negative than the base to emitter voltage of the transistor 101. As a result the transistor 103 will start to conduct current much faster than the transistor 101 and the potential at the collector of the transistor 103 will become less negative and rise above the voltage $-V_2$ whereupon the diode 115 will have a reverse voltage applied across it. The rise in potential at the collector of the transistor 103 is transmitted to the base of the transistor 101 through the parallel circuit of the resistor 127 and the capacitor 129. The potential at the base of the transistor 101 is driven positive in this manner and conduction through the transistor 101 is cut off. The back diode 123 will then have a reverse voltage applied across it and the potential at the base of the transistor 101 rises until the back diode 123 breaks down.

When the flip-flop reaches a stable state the transistor 103 will be fully conducting and the transistor 101 will be maintained in a cutoff condition by the connection of its base to the collector of the transistor 103 through the resistor 127. When a stable state is reached, the potential at the base of the transistor 103 will become less negative than the breakdown voltage of the back diode 125 so that the diode 125 will be non-conducting and effectively out of the circuit. The back diode 123 will be broken down so that the potential at the base of the transistor 101 will be the breakdown voltage of the back diode 123 minus the voltage across the tunnel diode 105. The diode 113 will still be conducting in the forward direction so that the potential at the collector of the transistor 101 remains at $-V_2$. The diode 115 due to the rise in voltage at the collector of the transistor 103 will have a voltage applied across it in its reverse direction and therefor will be effectively out of the circuit.

To switch the flip-flop to its opposite state, a negative pulse is applied to the terminal 135. This pulse will pass through the resistor 137, be applied across the tunnel diode 105, and cause it to switch to its high voltage state. When the tunnel diode 105 switches to its high voltage state, the voltage at its cathode becomes sharply more negative thus driving the emitter of the transistor 103 more negative. The voltage at the base of the transistor 103 cannot become more negative than the breakdown voltage of the back diode 125 and hence the emitter to base voltage of the transistor 103 is sharply decreased when the tunnel diode 105 switches to its high voltage state. Thus the conduction through the transistor 103 is decreased correspondingly. Also when the tunnel diode 105 switches to its high voltage state thus causing its cathode potential to become sharply more negative, the voltage at the base of the transistor 101 will become sharply less positive as the voltage drop across the broken down back diode 123 must remain constant. The drop in conduction through the transistor 103 causes the voltage at the collector of the transistor 103 to become more negative. This change in voltage at the collector of the transistor 103 is transmitted to the base of the transistor 101 through the parallel circuit of the resistor 127 and the capacitor 129 thus driving the base of the transistor 101 negative and causing it to start to conduct. As the transistor 101 starts to conduct the voltage at its collector will become less negative and the voltage across the diode 113 will be reversed. This rise in potential at the collector of the transistor 101 is transmitted to the base of the transistor 103 through the parallel circuit of the resistor 131 and the capacitor 133 raising the potential at the base of the transistor 103. The action is thus cumulative and the transistor 103 is driven quickly to cutoff and the transistor 101 is driven quickly to a fully conducting condition. When a stable state has been reached, the diode 115 will conduct in a forward direction and the voltage at the collector of the transistor 103 will be at the voltage $-V_2$. The voltage at the base of the transistor 103 will be positive thus maintaining the transistor 103 in a cutoff condition since the emitter of the transistor 103 is maintained at the relatively highly negative potential of the cathode of the tunnel diode 105. The base of the transistor 101 will assume approximately the same potential as the potential at the cathode of the tunnel diode 105. The diode 113 will have a voltage across it in the reverse direction.

To switch the flip-flop circuit back to its original state a positive pulse is applied at terminal 135, which positive pulse will be applied across the tunnel diode 105 through the resistor 137. This action will switch the tunnel diode 105 to its low voltage state. When the tunnel diode switches to its low voltage state, the voltage at the emitter of the transistor 103 becomes sharply less negative and the voltage at the base of the transistor 101 also becomes sharply less negative since the back diode 123 at this time is forward conducting. As a result the conduction through the transistor 101 is sharply reduced and the potential at the collector of the transistor 101 accordingly becomes more negative. This change in potential at the collector of the transistor 101 is transmitted to the base of the transistor 103 through the parallel circuit of the capacitor 133 and the resistor 131 driving the base of the transistor 103 negative and causing the transistor 103 to start to conduct. When the transistor 103 starts to conduct, the voltage at its collector becomes less negative causing a reverse voltage to be applied across the diode 115. The change in voltage at the collector of the transistor 103 is transmitted to the base of the transistor 101 through the parallel circuit of the resistor 127 and the capacitor 129 thus causing the base of the transistor 101 to become less negative and further decreasing the conduction through the transistor 101. The effect is thus cumulative and the transistor 103 is quickly switched to a fully conducting condition and the transistor 101 is quickly switched to a condition in which it is cut off. Thus the flip-flop is switched back to its original state.

It will be seen that the switching of the flip-flop is controlled by the switching of the diode tunnel 105 between its high and low voltage states in cooperation with the action of the back diodes 123 and 125. Because the action of the tunnel diode switching between its high and low voltage states is very fast, it speeds up the switching operation of the flip-flop circuit drastically reducing its switching time. It will be noted that the positive and negative pulses applied to the input terminal 135 are in direction to aid the switching operation. Thus a negative pulse applied to the input terminal 135 to switch the tunnel diode 105 to its high voltage state is also applied to the emitter of the transistor 103 tending to reduce the conduction through the transistor 103 and is also applied to the base of the transistor 101 through the back diode 123 tending to cause the transistor 101 to start conducting. Thus such a negative pulse tends to cause the flip-flop to switch states. However, the action of the tunnel diode 105 is much faster than the switching action of the transistors 101 and 103 and the effect of the pulse being applied to the transistors 101 and 103 is merely to increase the switching speed. Similarly a positive pulse applied to the input terminal 135 to switch the tunnel diode 105 from its high voltage state to its low voltage state also is applied to the emitter of the transistor 103 and the base of the transistor 101 in a direction to aid the switching operation thus increasing the switching speed.

If the tunnel diode 105 is composed of germanium, then the back diodes 123 and 125 and the transistors 101 and 103 must be composed also of germanium for the circuit of FIG. 1. If the tunnel diode is composed of gallium arsenide and the transistors 101 and 103 are composed of silicon in the circuit in FIG. 1, then the back diodes 123 and 125 must be gallium arsenide. If however, the transistors 101 and 103 are germanium with a gallium arsenide tunnel diode 105, then the back diodes 123 and 125 can be either germanium or gallium arsenide in the circuit of FIG. 1.

Figure 2:
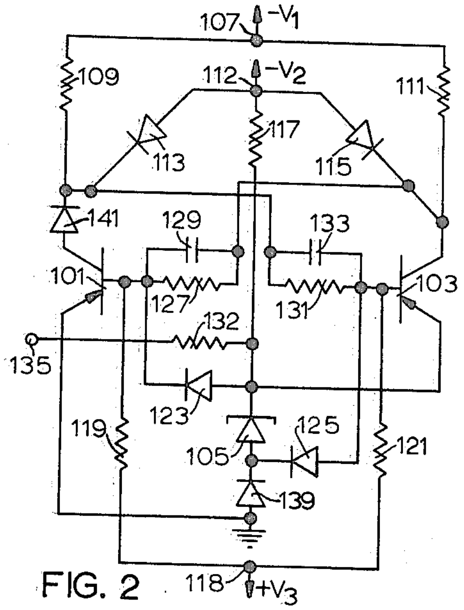

FIG. 2 illustrates the flip-flop circuit of FIG. 1 modified so as to operate with silicon transistors 101 and 103, a germanium tunnel diode, and gallium arsenide back diodes 123 and 125. This circuit is the same as FIG. 1 except that the anode of the tunnel diode 105, instead of being connected to ground, is connected to the cathode of a diode 139, the anode of which is grounded and the back diode 125 instead of being connected between the base of the transistor 103 and ground is connected between the base of the transistor 103 and the junction between the tunnel diode 105 and the diode 139. Also the collector of the transistor 101 is not connected directly to the junction between the resistor 109, the diode 113, the capacitor 133, and the resistor 131 as in the circuit of FIG. 1 but is connected to this junction through a diode 141 with the anode of the diode 141 being connected to the collector of the transistor 101. The diode 141 serves to equalize the voltage swings at both collectors of the transistors 101 and 103. The switching action of the circuit of FIG. 2 is the same as that described with reference to FIG. 1.

Figure 3:
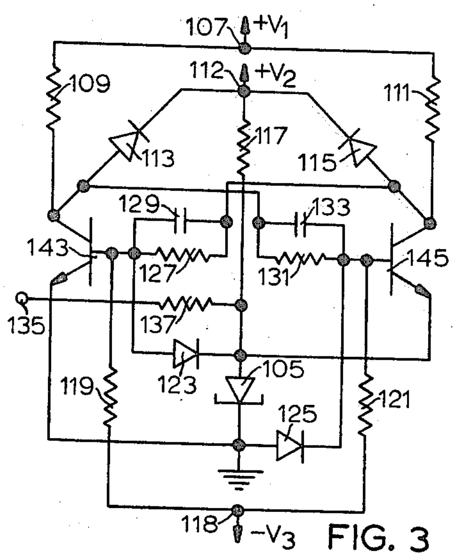
FIGS. 3 and 4 illustrate transistor circuits in accordance with the present invention in which NPN transistors are used.

FIG. 3 illustrates the flip-flop circuit of the present invention making use of NPN transistors 143 and 145 instead of PNP transistors 101 and 103. This circuit is the same as the circuit of FIG. 1 with the transistors 143 and 145 substituted for the transistors 101 and 103 except that the polarities of the tunnnel diode 105, the back diodes 123 and 125, and the diodes 113 and 115 have been reversed, and the polarities of the voltages $V_1$, $V_2$ and $V_3$ applied at the terminals 107, 112 and 118 have been reversed. The switching action of the circuit of FIG. 3 is the same as that of FIG. 1 except that the polarities of the voltages and the directions of voltage change are reversed. As in the circuit of FIG. 1, if the tunnel diode 105 in FIG. 3 is germanium, then the back diodes 123 and 125 must be germanium and the transistors 143 and 145 must be germanium. If the tunnel diode 105 is gallium arsenide and the transistors 143 and 145 are silicon, then the back diodes 123 and 125 must be gallium arsenide. If, however, germanium transistors 143 and 145 are used with a gallium arsenide tunnel diode 105, then the back diodes 123 and 125 may be either germanium or gallium arsenide.

Figure 4:
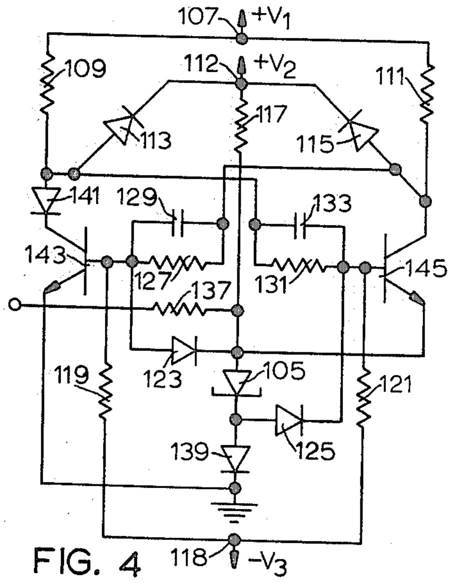

FIG. 4 illustrates the flip-flop circuit of FIG. 3 modified to operate with silicon transistors 143 and 145, a germanium tunnel diode 105 and gallium arsenide back diode 123 and 125. This circuit is the same as the circuit in FIG. 3 except that the junction between the tunnel diode 105 and the back diode 125 instead of being connected to ground is connected to the anode of the diode 139, the cathode of which is grounded and the collector of the transistor 143 instead of being directly connected to the junction between the resistor 109, the diode 113, the capacitor 133, and the resistor 131 is connected to the cathode of the diode 141, the anode of which is connected to this junction. As in the circuit of FIG. 2 the diode 141 serves to equalize the voltage swings at the collectors of the transistors.

Figure 5:
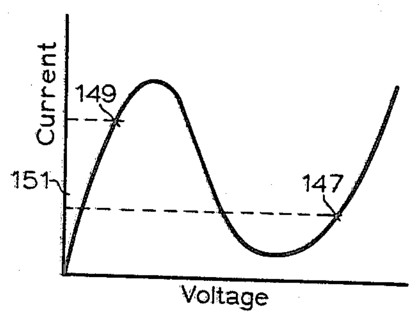
FIG. 5 illustrates the characteristic of a tunnel diode.

FIG. 5 illustrates the characteristic of the tunnel diode 105. The high voltage state of the tunnel diode is indicated on the characteristic by the point 147 and the point 149 on the characteristic indicates the low voltage state of the tunnel diode. When the tunnel diode is switched back and forth between its high and low voltage states it will be switched between these two points. The position of the points 147 and 149 on the characteristic is determined by the resistance of the tunnnel diode load resistor 117. In a germanium tunnel diode the voltage across the tunnel diode when the tunnel diode is in its high voltage state, as indicated on the characteristic by the distance between the point 147 and the ordinate axis 151, is 0.4 volt and the voltage across a germanium tunnel diode when the tunnel diode is in its low voltage state, as indicated by the distance between the point 149 and the ordinate axis 151, is 0.05 volt. In the case of a gallium arsenide tunnel diode the voltage across the tunnel diode in its high voltage state will be 1.0 volt and in its low voltage state will be 0.1 volt.

Figure 6:
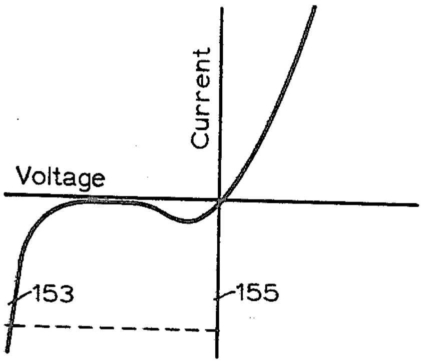
FIG. 6 illustrates the characteristic of a back diode.

FIG. 6 illustrates the characteristic of the back diodes 123 and 125. When these diodes are broken down they will be in that constant voltage portion of the characteristic shown in FIG. 6 indicated by the reference number 153 and the voltage across the back diodes when they are broken down is indicated by the distance between this substantially constant voltage portion 153 and the ordinate axis 155. In a germanium back diode this breakdown voltage is 0.55 volt and in a gallium arsenide back diode this breakdown voltage is 1.0 volt.

Figure 7:
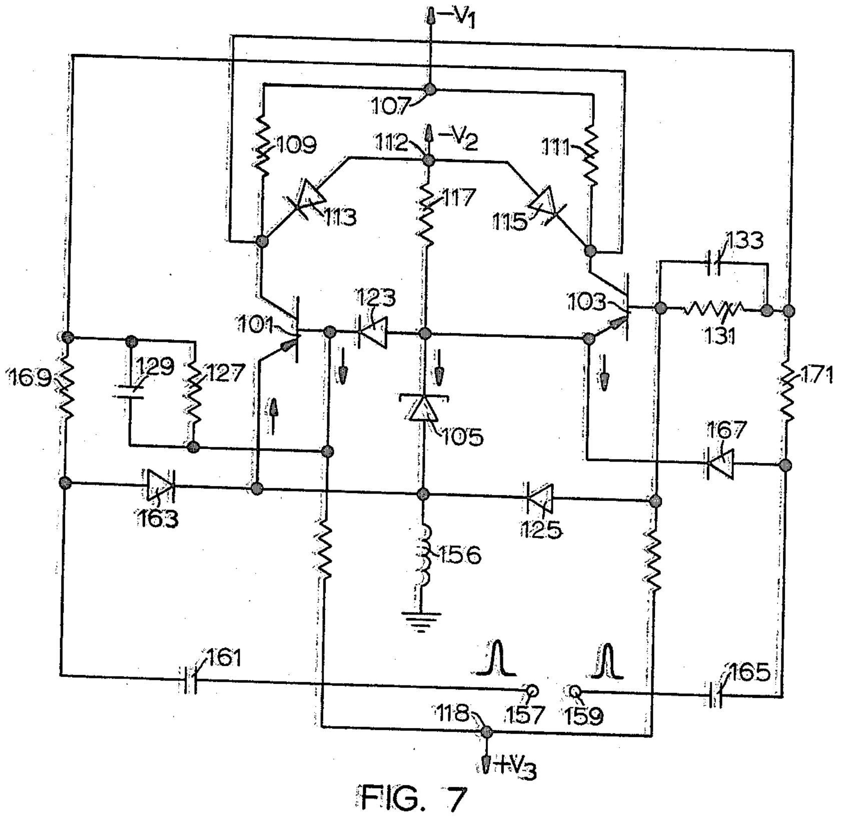
FIG. 7 illustrates substantially the same flip-flop circuit as that shown in FIG. 1 with a different system of triggering.

FIG. 7 illustrates a different system for triggering the circuit of FIG. 1 in place of the resistor 137 connecting the input terminal 135 to the cathode of the tunnel diode 105. The entire circuit shown in FIG. 1 is retained in the circuit of FIG. 7 except that the resistor 137 and the input terminal 135 are eliminated and the junction between the tunnel diode 105, the back diode 125 and the emitter of the transistor 101 instead of being connected directly to ground is connected to ground through an inductor 156. The input terminals 157 and 159 are provided. The input terminal 157 is connected through a capacitor 161 and a diode 163 to the anode of the tunnel diode 105 with the cathode of the diode 163 being connected directly to the anode of the tunnel diode 105. The terminal 159 is connected through a capacitor 165 and a diode 167 to the emitter of the transistor 103 with the cathode of the diode 167 being connected directly to the emitter of the transitor 103. A resistor 169 connects the junction between the capacitor 161 and the diode 163 to the collector of the transistor 103 and a resistor 171 connects the junction between the capacitor 165 and the diode 167 to the collector of the transistor 101. With this arrangement a positive pulse applied to the input terminal 157 will be applied to the anode of the tunnel diode 105 and will switch the tunnel diode 105 to its high voltage state and in response to the switching of the tunnel diode, the flip-flop will switch to its opposite state. The pulse applied to the anode of the tunnel diode 105 is also applied to the emitter of the transistor 101 and is in the direction to aid the switching action. A positive pulse applied to the input terminal 159 is applied through the capacitor 165 and the diode 167 to the cathode of the tunnel diode 105 and will switch the tunnel diode from its high voltage state to its low voltage state. In response to this switching, the flip-flop will switch back to its original state. The pulse applied to the cathode of the diode 105 is also applied directly to the emitter of the transistor 103 and to the base of the transistor 101 through the back diode 123 in a direction to aid the switching action and thus serves to speed up the switching action. The resistors 169 and 171 serve to provide steering of the trigger pulses applied to the input terminals 157 and 159 thus providing good noise immunity. In the circuit of FIG. 7 instead of using the inductor 156 a diode could be used having its anode connected to ground.

Figure 8:
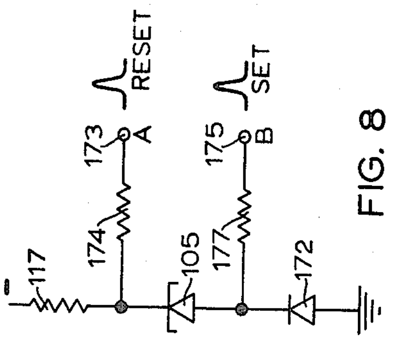

FIG. 8 illustrates another system of triggering the flip-flop circuit of FIG. 1. In FIG. 8 only the part of the flip-flop circuit comprising the tunnel diode 105 and the load resistor 117 has been shown to simplify the illustration. As shown in FIG. 8 the anode of the tunnel diode instead of being connected to ground is connected to the cathode of a diode 172, the anode of which is grounded. An input terminal 173 is connected to the cathode of the tunnel diode 105 through a resistor 174 and an input terminal 175 is connected to the anode of the tunnel diode 105 through a resistor 177. When a positive pulse is applied to the terminal 175 it will pass through the resistor 177 and be applied to the tunnel diode 105. This will cause the tunnel diode to be switched from its low voltage state to its high voltage state and thus cause the flip-flop circuit to switch to its opposite state. A positive pulse applied to the terminal 173 will pass through the resistor 174 and be applied to the cathode of the tunnel diode 105. In response to such a pulse the tunnel diode 105 would switch from its high voltage state to its low voltage state thus switching the flip-flop back to its original state.

Figure 9:
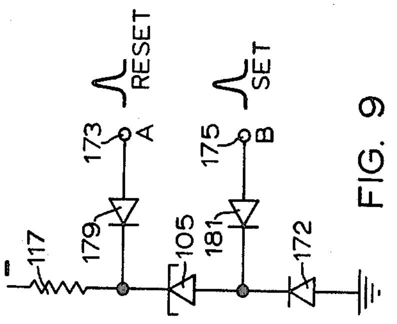

FIG. 9 illustrates another scheme for triggering the flip-flop circuit. In FIG. 9 as in FIG. 8 only that portion of the flip-flop circuit comprising the tunnel diode 105 and the load resistor 117 have been shown to simplify the illustration. The scheme of FIG. 9 is similar to the scheme of FIG. 8 except that diodes 179 and 181 have been substituted for the resistors 174 and 177. Positive pulses applied to the terminals 173 and 175 serve to switch the state of the flip-flop in the scheme of FIG. 9 in the same manner as in FIG. 8.

Figure 10:
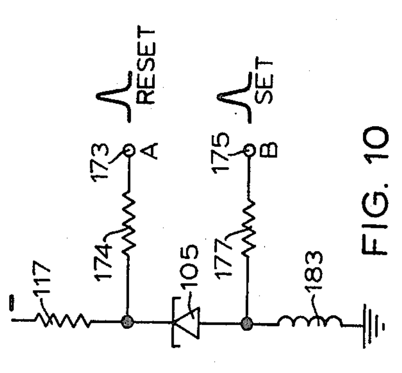
FIGS. 8 through 13 illustrate alternative systems of triggering the flip-flop circuit of FIG. 1.

FIG. 10 illustrates still another scheme for triggering the flip-flop circuit of FIG. 1. In the scheme of FIG. 10 as in FIGS. 8 and 9 only the portion of the flip-flop circuit comprising the tunnel diode 105 and the load resistor 117 are shown to simplify the illustration. The scheme of FIG. 10 is the same as that of FIG. 8 except that an inductor 183 has been substituted for the diode 172. Positive pulses will function to switch the state of the flip-flop in the scheme of FIG. 10 by being applied to the input terminals 173 and 175 in the same manner as in the scheme of FIG. 8. In addition in the scheme of FIG. 10 negative pulses may be used to switch the flip-flop. When a negative pulse is applied to the input terminal 173 it will be applied through the resistor 174 to the cathode of the tunnel diode 105. In response to such a negative pulse the tunnel diode 105 would be switched from its low voltage state to its high voltage state thus effecting the switching of the flip-flop circuit. Similarly when a negative pulse is applied to the terminal 175 it will be applied through the resistor 177 to the anode of the tunnel diode 105. In response to such a negative pulse the tunnel diode 105 would be switched from its high voltage state to its low voltage state thus effecting a switching of the flip-flop circuit.

Figure 11:
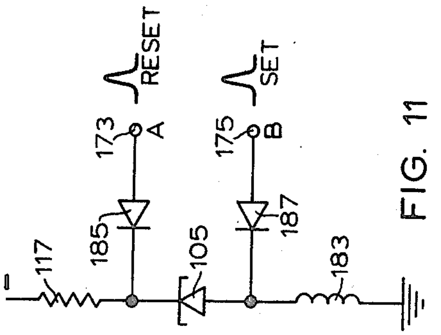

The switching scheme illustrated in FIG. 11, which like FIGS. 8, 9 and 10 only shows the part of the flip-flop circuit comprising the tunnel diode 105 and the load resistor 117, is like the switching scheme of FIG. 10 except that diodes 185 and 187 have been substituted for the resistors 174 and 177 respectively. The diode 185 has its anode connected to the input terminal 173 and the diode 187 has its anode connected to the input terminal 175. This triggering scheme shown in FIG. 11 will function in response to positive pulses in the same manner that the triggering scheme shown in FIG. 10 functions in response to positive pulses.

Figure 12:
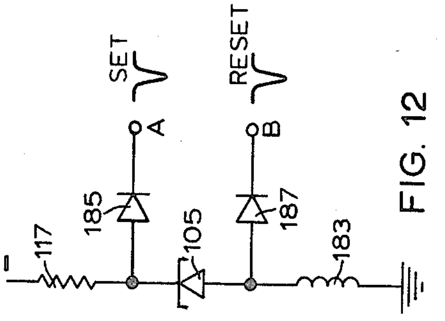

FIG. 12 illustrates a triggering scheme which functions in response to negative pulses. FIG. 12 like FIGS. 8–11 only illustrates the part of the flip-flop circuit comprising the resistor 117 and the tunnel diode 105. The scheme of FIG. 12 is like that of FIG. 11 except that the polarities of the diodes 185 and 187 have been reversed. The scheme of FIG. 12 will function in response to negative pulses to switch the flip-flop circuit in the same manner as that of FIG. 10.

Figure 13:
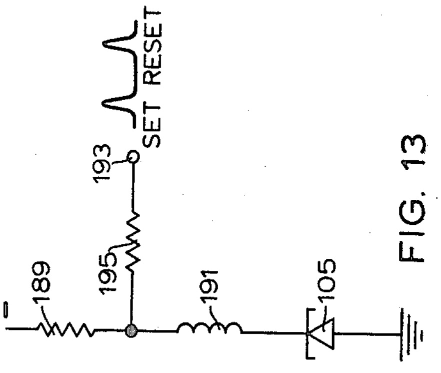

FIG. 13 illustrates still another scheme of switching the flip-flop circuit. In FIG. 13 only that portion of the flip-flop circuit comprising the tunnel diode and the load resistor for the tunnel diode has been illustrated as in FIGS. 9–12. In FIG. 13 however, the load resistor 117 has been replaced by a series circuit of a resistor 189 and an inductor 191. This series circuit is designed to have the same load characteristics as the load resistor 117. An input terminal 193 is connected to the junction between the resistor 189 and the inductor 191 through a resistor 195. With the values of the inductance 191, the resistance 189, and the voltage minus $V_2$ applied at the terminal 112 properly selected, the tunnel diode 191 will change state with each positive pulse applied to the input terminal 193. The first pulse will switch the tunnel diode to its high voltage state thus effecting the switching of the flip-flop circuit and the next pulse will switch the tunnel diode back to its low voltage state thus again effecting the switching of the flip-flop circuit.

The switching schemes illustrated in FIGS. 7–13 are just but a few of the many and various switching schemes which may be used in the flip-flop circuit shown in FIG. 1. It will be obvious how these switching schemes as well as many others may be adapted to operate on the flip-flop circuits of FIGS. 2–4.

Thus there is provided a flip-flop circuit which has a much faster switching time than the flip-flop circuits of the prior art and which requires a switching pulse of much shorter duration and much less energy to effect switching than those of the prior art. The above-described circuits are of specific embodiments of the invention and many modifications may be made thereto without departing from the spirit and scope of the invention, which is defined in the appended claims.

What is claimed:

1. A flip-flop comprising a first amplifying circuit member having first, second and third electrodes and operative to control conduction between said first and second electrodes in response to the voltage between said first and third electrodes, a second amplifying circuit member having first, second and third electrodes and operative to control the conduction between said first and second electrodes in response to the voltage between said first and third electrodes, a source of D.C. power adapted to supply a D.C. voltage between first and second output terminals, a first resistance connected between the second electrode of said first amplifying circuit member and the first terminal of said source of D.C. power, a second resistance connected between the second electrode of said second amplifying circuit member and the first terminal of said source of D.C. power, a tunnel diode connected between the first electrode of said first amplifying circuit member and the second terminal of said source of D.C. power, electrically conducting means connected between the first terminal of said second amplifying circuit member and the second terminal of said source of D.C. power, means driving the third terminal of said second amplifying circuit member with the voltage swings at the second terminal of said first amplifying circuit member, means driving the third electrode of said first amplifying circuit member with the voltage swings at the second electrode of said second amplifying circuit member, a back diode connected between the third electrode of said first amplifying circuit member and the second terminal of said source of D.C. power, a back diode connected between the third electrode of said second amplifying circuit member and the connection between said tunnel diode and the first electrode of said first amplifying circuit member, circuit means connecting said tunnel diode to have a low voltage stable state and a high voltage stable state, means including an input terminal for applying a trigger pulse to switch said tunnel diode alternately between said high voltage and low voltage states.

2. A flip-flop as recited in claim 1 wherein said first and second amplifying circuit members comprise transistors in which the first electrode comprises the emitter, the second electrode comprises the collector and the third electrode comprises the base thereof.

3. A flip-flop comprising a first amplifying circuit member having first, second and third electrodes and operative to control the conduction between said first and second electrodes in accordance with the voltage between said first and third electrodes, a second amplifying circuit member having first, second and third electrodes and operative to control the conduction between said first and second electrodes in accordance with the voltage between said first and third electrodes, a first resistance connected to the second electrode of said first amplifying circuit member to form a first series circuit with the first and second electrodes of said first amplifying circuit member, a second resistance connected to the second electrode of said second amplifying circuit member to form a second series circuit with the first and second electrodes of said second amplifying circuit member, a tunnel diode connected between corresponding electrodes of said amplifying circuit members, means driving the third electrode of said second amplifying circuit member in accordance with the voltage swings at the second electrode of said first amplifying circuit member, means driving the third electrode of said first amplifying circuit member in accordance with the voltage swings at the second electrode of said second amplifying circuit member, circuit means adapted to apply a D.C. voltage across said first series circuit and across said second series circuit and connecting said tunnel diode to have a low voltage stable state and a high voltage stable state, means including an input terminal for applying a trigger pulse to switch said tunnel diode alternately between said high voltage and low voltage states, said circuit means being responsive to the switching of said tunnel diode from said low voltage stable state to said high voltage stable state to decrease the conduction between the first and second electrodes of said first amplifying circuit member and responsive to the switching of said tunnel diode from said high voltage state to said low voltage state to decrease the conduction between the first and second electrodes of said second amplifying circuit member.

4. A flip-flop as recited in claim 3 wherein said first and second amplifying circuit members are transistors with the first electrode being the emitter, the second electrode being the collector and the third electrode being the base thereof.

5. A flip-flop comprising a first transistor, a second transistor, means responsive to a change in conduction through said first transistor to cause the opposite change in conduction through said second transistor, means responsive to a change in conduction through said second transistor to cause the opposite change in conduction through said first transistor, a single tunnel diode, circuit means connecting said tunnel diode, between corresponding electrodes of said transistors, to have a high voltage stable state and a low voltage stable state, means including an input terminal for applying a trigger pulse to switch said tunnel diode alternately between said high voltage and low voltage states, and means responsive to the switching of said tunnel diode from said low voltage stable state to said high voltage stable state to decrease the conduction through said first transistor and responsive to the switching of said tunnel diode from said high voltage stable state to said low voltage stable state to decrease the conduction through said second transistor.

6. A flip-flop comprising a first multi-electrode amplifying circuit member, a second multi-electrode amplifying circuit member, means responsive to a change in conduction through said first amplifying circuit member to cause an opposite change in conduction in said second amplifying circuit member, means responsive to a change in conduction through said second amplifying circuit member to cause an opposite change in conduction through said first amplifying circuit member, a single tunnel diode, circuit means connecting said tunnel diode, between corresponding electrodes of said circuit members, to have a high voltage stable state and a low voltage stable state, means including an input terminal for applying a trigger pulse to switch said tunnel diode alternately between said high voltage and low voltage states, and means responsive to the switching of said tunnel diode from said low voltage stable state to said high voltage stable state to decrease the conduction through said first amplifying circuit member and responsive to the switching of said tunnel diode from said high voltage state to said low voltage state to decrease conduction through said second amplifying circuit member.

7. A flip-flop comprising a first transistor, a second transistor, a circuit including said first and second transistors having a first stable state in which said first transistor conducts and said second transistor is non-conductive and a second stable state in which said second transistor conducts and said first transistor is non-conductive, a single tunnel diode, circuit means connecting said tunnel diode, between corresponding electrodes of said first and second transistors, to have a low voltage stable state and a high voltage stable state, means including an input terminal for applying a trigger pulse to switch said tunnel diode alternately between said high voltage and low voltage states and circuit means responsive to the switching of said tunnel diode from said low voltage state to said high voltage state to drive said circuit from said first stable state to said second stable state and responsive to the switching of said tunnel diode from said high voltage state to said low voltage state to drive said circuit from said second stable state to said first stable state.

8. A flip-flop circuit comprising a first multi-electrode amplifying circuit member, a second multi-electrode amplifying circuit member, a circuit including said first and second amplifying circuit members having a first stable state in which said first amplifying circuit member conducts and second amplifying circuit member is non-conductive and a second stable state in which said second amplifying circuit member conducts and said first amplifying circuit member is non-conductive, a single tunnel diode, circuit means connecting said tunnel diode, between corresponding electrodes of said first and second amplifying circuit members, to have a low voltage stable state and a high voltage stable satte, means including an input terminal for applying a trigger pulse to switch said tunnel diode alternately between said high voltage and low voltage states, and circuit means responsive to the switching of said tunnel diode from its low voltage state to its high voltage state to drive said circuit from said first stable state to said second stable state and responsive to the switching of said tunnel diode from said high voltage state to said low voltage state to drive said circuit from its second stable state to its first stable state.

References Cited by the Examiner

UNITED STATES PATENTS

| | | | |
|---|---|---|---|
| 2,620,440 | 12/52 | Baker | 328—49 X |
| 3,102,209 | 8/63 | Pressman | 307—88.5 |

JOHN W. HUCKERT, *Primary Examiner.*

ARTHUR GAUSS, *Examiner.*